(12) United States Patent
Onizuka

(10) Patent No.: US 6,390,830 B1
(45) Date of Patent: May 21, 2002

(54) BUS BAR-CONNECTING STRUCTURE

(75) Inventor: Takahiro Onizuka, Nagoya (JP)

(73) Assignees: Sumitomo Wiring Systems, Ltd.; Sumitomo Electric Industries, Ltd.; Autonetworks Technologies, Ltd., all of Tokyo (JP)

( * ) Notice: Subject to any disclaimer, the term of this patent is extended or adjusted under 35 U.S.C. 154(b) by 0 days.

(21) Appl. No.: 09/660,401

(22) Filed: Sep. 12, 2000

(30) Foreign Application Priority Data

Oct. 29, 1999 (JP) ............................................ 11-309714

(51) Int. Cl.$^7$ ................................................ H01R 9/22
(52) U.S. Cl. ........................................ 439/76.2; 439/721
(58) Field of Search ................................ 439/76.2, 721, 439/723, 874, 43, 49

(56) References Cited

U.S. PATENT DOCUMENTS

| | | |
|---|---|---|
| 2,977,672 A | 4/1961 | Telfer |
| 5,139,924 A | 8/1992 | Svensson ..................... 430/314 |
| 6,008,982 A | * 12/1999 | Smith ......................... 439/76.2 |
| 6,325,640 B1 | * 12/2001 | Kasai ......................... 439/76.2 |

FOREIGN PATENT DOCUMENTS

| | | |
|---|---|---|
| EP | 0 887 8847 A2 | 12/1998 |
| JP | A 11-180649 | 7/1999 |

* cited by examiner

Primary Examiner—Gary Paumen
(74) Attorney, Agent, or Firm—Oliff & Berridge, PLC

(57) ABSTRACT

Vertical bus bars 17A to 17E are arranged on an upper side of an insulating plate 15 while horizontal bus bars 16A to 16D are arranged on a lower side of the insulating plate 15. A laser beam LB is applied to the vertical bus bars 17A to 17E at selected ones (that is, intersection portions (1) to (8)) of the intersection portions of the bus bars 16A to 16D and 17A to 17E, so that each laser beam-applied portion of the vertical bus bars 17A to 17E is fused or melted, and this fused portion flows through a through hole 15a, and is fused to the mating bus bar 16 (A to D) while melting part of this bus bar 16 (A to D), and as a result the bus bars 16A to 16D and the bus bars 17A to 17E, disposed on the opposite sides of the insulating plate 15, are electrically connected together.

3 Claims, 6 Drawing Sheets

BUS BAR-CONNECTING STRUCTURE

BACKGROUND OF THE INVENTION

1. Field of the Invention

This invention relates to a bus bar-connecting structure adapted to be received in an electric connection box.

2. Description of the Related Art

An electric connection box is used for branch connection of an automobile wire harness or the like to various electric equipments, and serves to provide one centralized branch connection point so as to effect the branch connection of wiring in a rational and economical manner. With a high-density design of wire harnesses, there have now been developed various types of electric connection boxes designed respectively for various kinds of automobiles and various uses.

With respect to bus bars to be received in such an electric connection box, a plurality of kinds of bus bars are blanked from a hoop material with a press dies, and tab terminals are formed on each bus bar by stamping a pattern portion thereof, and the bus bars are arranged in layers, with an insulating plate interposed between the adjacent layers of bus bars, and this bus bar structure is received in the electric connection box.

However, the pattern portions of these bus bars are different in shape, and therefore the bus bars need to be blanked with their respective exclusive-use press dies, and therefore the production cost is high, And besides, even in the electric connection box for the same kind of automobile, the pattern portions of the bus bars vary in shape, depending on the grade of the automobile, and this has invited a problem that the general-purpose ability can not be obtained.

Therefore, the Applicant of the present application has earlier proposed a bus bar-connecting structure (see JP-A-11-180649) in which vertical bus bars (arranged in columns) are arranged on one side of an insulating plate while horizontal bus bars (arranged in rows) are arranged on the other side of the insulating plate, and indent portions of the bus bars, disposed at least on one of the opposite sides of the insulating plate, are fitted into through holes in the insulating plate at selected ones of intersection portions of the bus bars disposed on the opposite sides of the insulating plate, and each of the indent portions is held in contact with the opposed bus bar, and is welded thereto, thereby electrically connecting the bus bars, disposed on the one side of the insulating plate, to the bus bars on the other side.

In this conventional technique, it is only necessary to arrange the common straight vertical and horizontal bus bars in a combined manner and then to weld the indent portions at those intersection portions at which the upper layer of bus bars and the lower layer of bus bars are to be connected together. Therefore, in contrast with the conventional structure, it is not necessary to blank the bus bars into different pattern shapes with exclusive-use press-dies, and therefore the production cost is reduced. And besides, by changing the positions of the indent portions, the bus bar-connecting structure can meet any pattern configuration of the bus bars, and therefore the time and labor, required for the design of a circuit, can be greatly reduced, and besides a design change, necessitated by a slight circuit change, can be rapidly dealt with, thus achieving an advantage that the general-purpose ability is enhanced.

SUMMARY OF THE INVENTION

This invention is directed to an improvement over the above bus bar-connecting structure proposed by the Applicant of the present application, and an object of the invention is to provide a bus bar-connecting structure which can be produced at a lower cost, and has an excellent general-purpose ability.

In order to achieve the above object, the present invention provides a bus bar-connecting structure for being received in an electric connection box, CHARACTERIZED in that:

vertical bus bars are arranged on one side of an insulating plate at a predetermined pitch, and extend straight in a vertical direction while horizontal bus bars are arranged on the other side of the insulating plate at a predetermined pitch, and extend straight in a horizontal direction; and through holes are formed respectively through those portions of the insulating plate, disposed respectively at intersection portions of the vertical bus bars and the horizontal bus bars provided on the opposite sides of the insulating plate; and a laser beam is applied to the bus bars, disposed on one of the opposite sides of the insulating plate, at selected ones of the intersection portions, so that each laser beam-applied portion of the bus bars is melted, and flows through the through hole, and is fused to the mating bus bar on the other side of the insulating plate, and the bus bars, disposed on the opposite sides of the insulating plate, are electrically connected together.

In the invention, the vertical bus bars are arranged on the one side of the insulating plate while the horizontal bus bars are arranged on the other side of the insulating plate, and a laser beam is applied to the bus bars, disposed on one of the opposite sides of the insulating plate, at selected ones of the intersection portions, so that each laser beam-applied portion of the bus bars i smelted, and flows through the through hole, and is fused to the mating bus bar on the other side of the insulating plate, and the bus bars, disposed on the opposite sides of the insulating plate, are electrically connected together.

Selected ones of the intersection portions of the bus bars are removed. With this construction, the bus bars-, arranged in the same layer, are electrically disconnected from each other, thereby providing independent circuits.

DETAILED DESCRIPTION OF THE PREFERRED EMBODIMENTS

A preferred embodiment of the present invention will now be described in detail with reference to the drawings.

Figure 4:
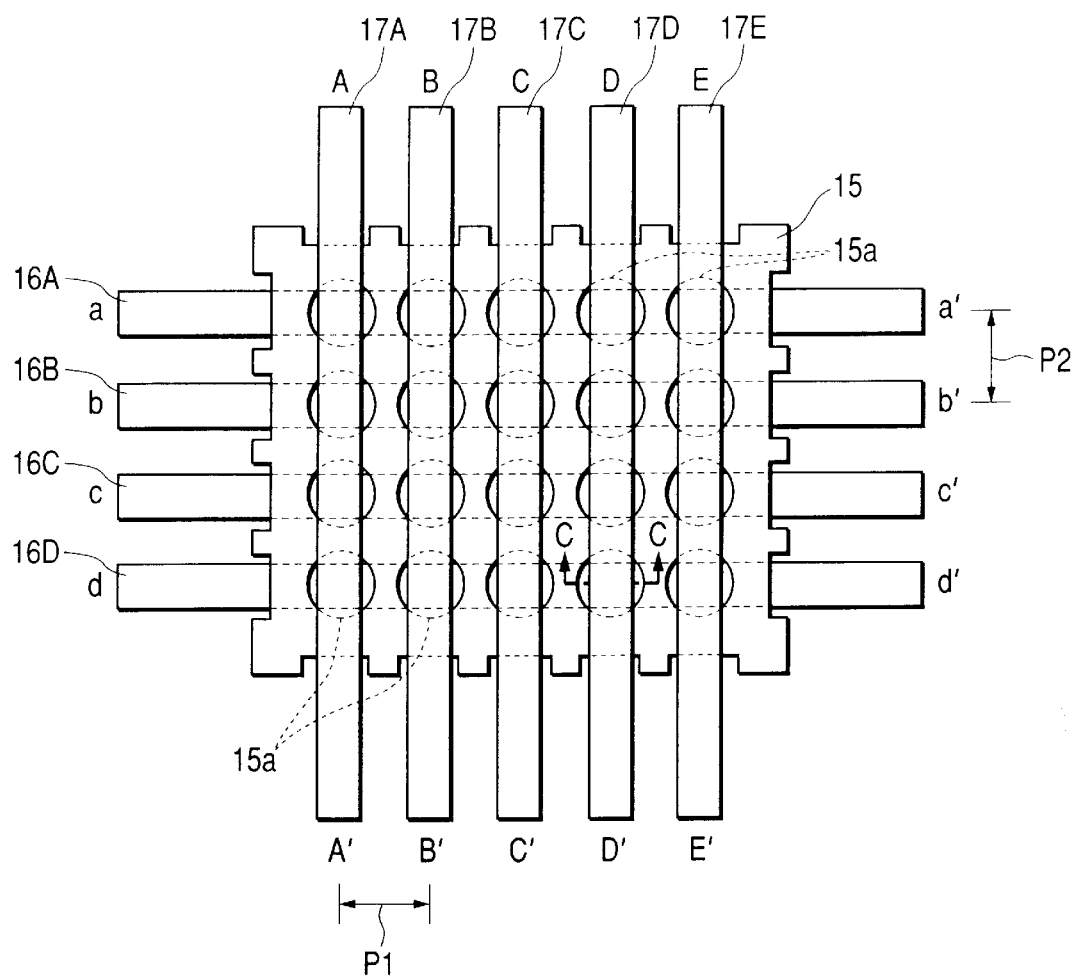
FIG. 4 is a plan view of the bus bar-connecting structure before laser welding and a removal operation are applied.
Figure 5:
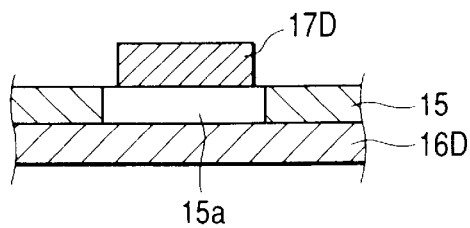
FIG. 5 is an enlarged cross-sectional view taken along the line C—C of FIG. 4.
Figure 6A:
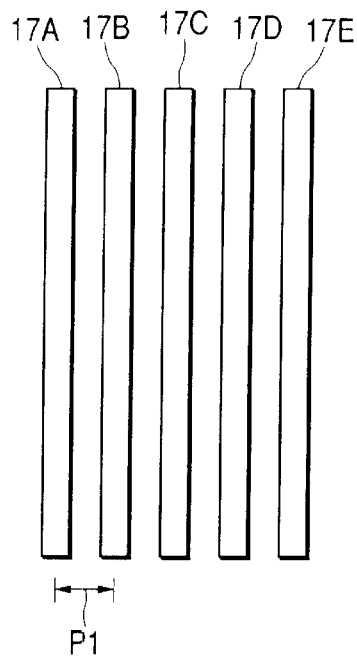
FIG. 6A is a plan view of vertical bus bars.
Figure 6B:
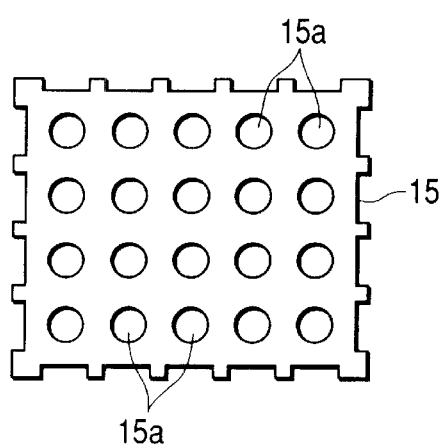
FIG. 6B is a plan view of an insulating member.
Figure 6C:
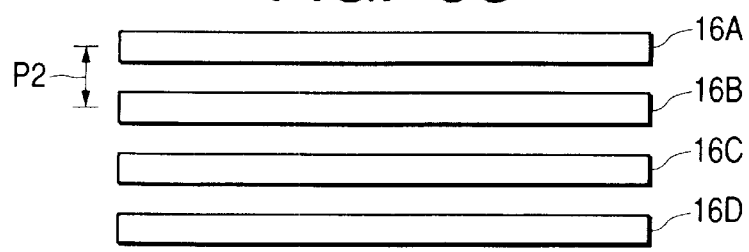
FIG. 6C is a plan view of horizontal bus bars.
Figure 7:
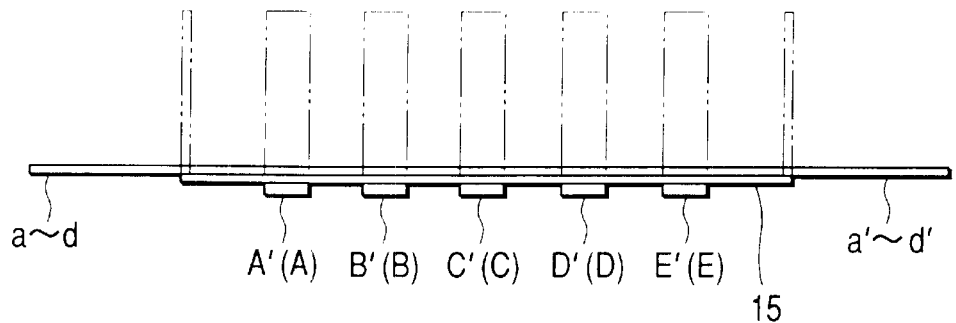
FIG. 7 is a side-elevational view of the structure of FIG. 1.

As shown in FIGS. 4 to 6C, vertical bus bars 17A, 17B, 17C, 17D and 17E are arranged on an upper side of a rectangular insulating plate 15 at a predetermined pitch P1, and extend straight in a vertical direction (assuming that the sheet of FIG. 4 is disposed perpendicularly to a horizontal plane) while horizontal bus bars 16A, 16B, 16C and 16D are arranged on a lower side of the insulating plate 15 at a predetermined pitch P2, and extend straight in a horizontal direction.

Through holes 15a are formed respectively through those portions of the insulating plate 15, disposed respectively at intersection portions of the bus bars 16A to 16D and the bus bars 17A to 17E provided on the opposite sides of the insulating plate 15, and are arranged in a grid-like manner, each of the through holes 15a having a diameter larger than the width of the bus bars 16A to 16D and 17A to 17E.

Figure 1:
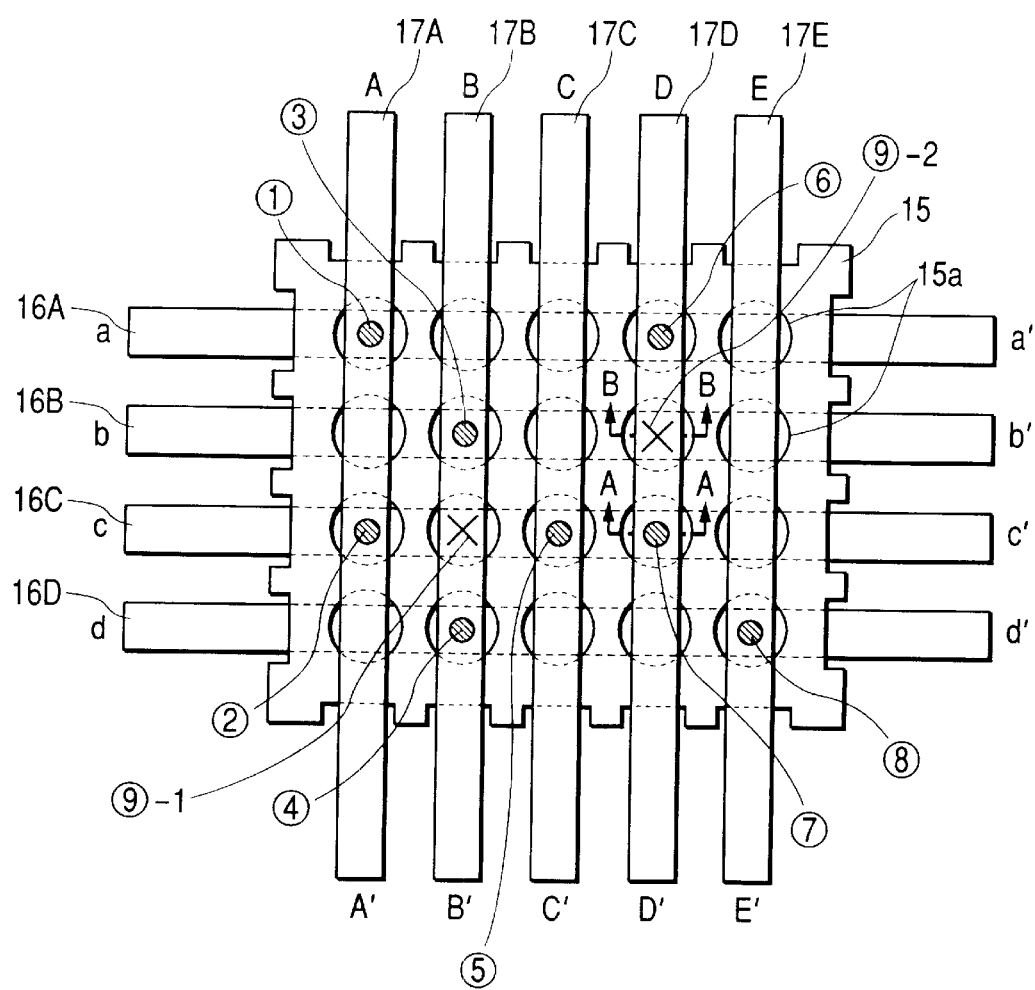
FIG. 1 is a plan view of a bus bar-connecting structure of the invention, showing laser-welded portions and removed portions.
Figure 2A:
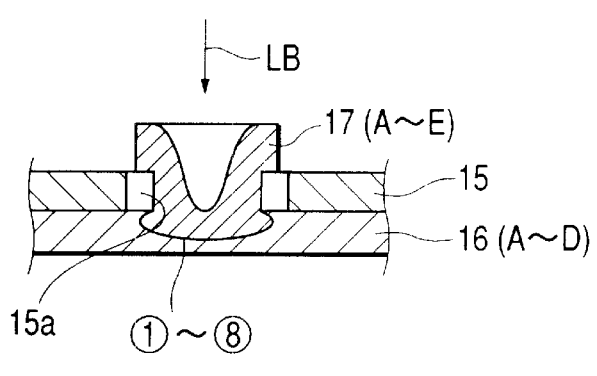
FIG. 2A is an enlarged cross-sectional view taken along the line A—A of FIG. 1.

A laser beam LB is applied to the upper vertical bus bars 17A to 17E at selected ones (that is, the intersection portions (1) to (8) indicated by mark• in FIG. 1) of the intersection portions of the bus bars 16A to 16D and 17A to 17E, so that each laser beam-applied portion of the vertical bus bars 17A to 17E is fused or melted, and this fused portion flows through the through hole 15a (while generally filling up a gap (for example, of around 0.5 mm) between the bus bar 16 (A to D) and the bus bar 17 (A to E)), and is fused to the mating bus bar 16 (A to D) while melting part of this bus bar 16 (A to D), as shown in FIG. 2A, and as a result the bus bars 16A to 16D and the bus bars 17A to 17E, disposed on the opposite sides of the insulating plate 15, are electrically connected together at the intersection portions (1) to (8).

More specifically, the intersection portion (1) is the. intersection of the vertical bus bar 17A and the horizontal bus bar 16A, the intersection portion (2) is the intersection of the vertical bus bar 17A and the horizontal bus bar 16C, the intersection portion (3) is the intersection of the vertical bus bar 17B and the horizontal bus bar 16B, and the intersection portion (4) is the intersection of the vertical bus bar 17B and the horizontal bus bar 16D.

The intersection portion (5) is the intersection of the vertical bus bar 17C and the horizontal bus bar 16C, the intersection portion (6) is the intersection of the vertical bus bar 17D and the horizontal bus bar 16A, the intersection portion (7) is the intersection of the vertical bus bar 17D and the horizontal bus bar 16C, and the intersection portion (8) is the intersection of the vertical bus bar 17E and the horizontal bus bar 16D.

Figure 2B:
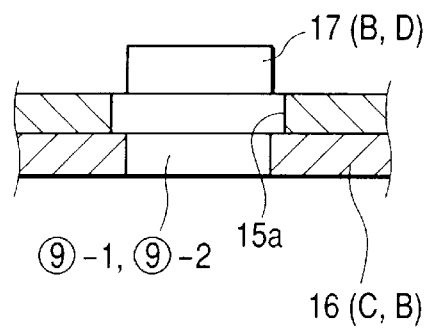
FIG. 2B is an enlarged cross-sectional view taken along the line B—B of FIG. 1.

Selected ones (that is, the intersection portions (9)-1 and (9)-2 indicated by mark X in FIG. 1) of the intersection portions of the bus bars 16A to 16D and 17A to 17E are removed as shown in FIG. 2B, and more specifically the intersection portion of the bus bars 17B and 16C, disposed on the opposite sides of the insulating plate 15, as well as the intersection portion of the bus bars 17D and 16B, is removed, so that the two bus bars 17B and 16C, as well as the two bus bars 17D and 16B are not electrically connected together.

As a result, with respect to tab terminals a to d and a' to d', defined respectively by opposite end portions of the bus bars 16A to 16D, and tab terminals A to E and A' to E', defined respectively by opposite end portions of the bus bars 17A to 17E, four circuits, independent of one another, are formed as shown in FIGS. 3A to 3D.

Figure 3A:
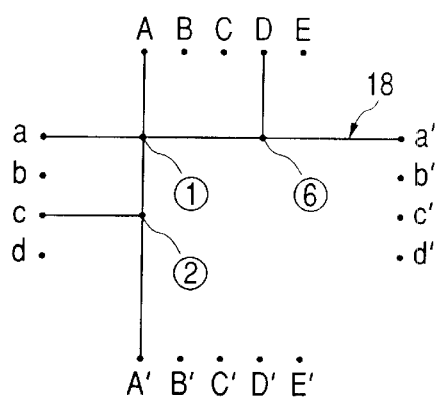
FIGS. 3A to 3D are circuit diagrams showing the bus bar-connecting structure, respectively.
Figure 3B:
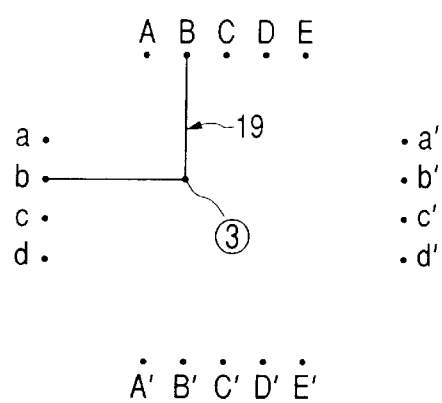
Figure 3C:
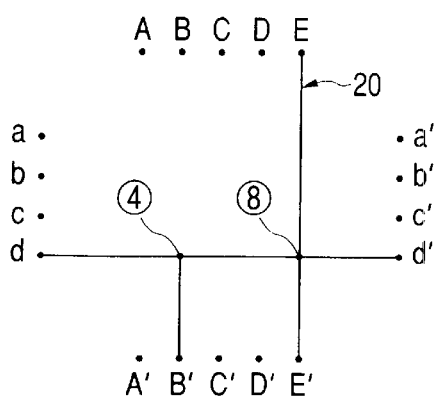
Figure 3D:
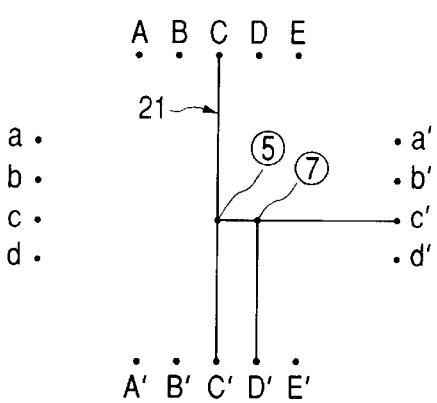

More specifically, FIG. 3A shows the circuit 18 in which five tab terminals a, c, A, D, a' and A' are electrically connected together, FIG. 3B shows the circuit 19 in which two tab terminals b and B are electrically connected together, FIG. 3C shows the circuit 20 in which five tab terminals d, E, d', B' and E' are electrically connected together, and FIG. 3D shows the circuit 21 in which four tab terminals C, c', C' and D' are electrically connected together.

Effects of this embodiment will now be described. A laser beam LB is applied to the upper vertical bus bars 17A to 17E at the intersection portions (1) to (8) of the vertical bus bars 17A to 17E, disposed on the upper side of the insulating plate 15, and the horizontal bus bars 16A to 16D disposed on the lower side of the insulating plate 15, so that the bus bars 16A to 16D and the bus bars 17A to 17E, disposed on the opposite sides of the insulating plate 15, are electrically connected together at the intersection portions (1) to (8). Also, the intersection portion (9)-1 of the bus bars 17B and 16C, disposed on the opposite sides of the insulating plate 15, as well as the intersection portion (9)-2 of the bus bars 17D and 16B, is removed, so that the two bus bars 17B and 16C are not electrically connected together at the intersection portion (9)-1, and the two bus bars 17D and 16B are not: electrically connected together at the intersection portion (9)-2, and as a result the four independent circuits 18 to 21 are formed.

Therefore, unlike the conventional bus bar structure, the insulating plate 15, the vertical bus bars 17A to 17E and the horizontal bus bars 16A to 16D can jointly provide a common basic structure. And, it is only necessary to arrange these straight vertical and horizontal bus bars 17A to 17E and 16A to 16D in a combined manner and then to apply laser welding to the intersection portions (1) to (8). Therefore, in contrast with the conventional structure, it is not necessary to blank the bus bars into different pattern shapes with the exclusive-use press-dies, and therefore the production cost is reduced.

And besides, by changing the intersection portions to be subjected to laser welding, the bus bar-connecting structure can meet any pattern configuration of the bus bars, and therefore the time and labor, required for the design of the circuit, can be greatly reduced, and besides a design change, necessitated by a slight circuit change, can be rapidly dealt with, thus achieving an advantage that the general-purpose ability is markedly enhanced.

Furthermore, since the connector tab terminals a to d, a' to d', A to E and A' to E' are formed at the opposite ends of the bus bars 16A to 16D and 17A to 17E, respectively, it is not necessary to secure separate tab terminals to these bus bars by welding or the like, and therefore the production cost is reduced.

Furthermore, the intersection portion (9)-1 of the bus bars 17B and 16C, disposed respectively on the opposite sides of the insulating plate 15, as well as the intersection portion (9)-2 of the bus bars 17-D and 16B, is removed, and therefore the bus bars 17B and 16C, as well as the bus bars 17D and 16B, arranged in the same layer, are electrically disconnected from each other, thereby providing the independent circuits, and therefore the number of the circuits can be increased.

Unlike the conventional bus bar structure, there is no need to form any indent portion at the bus bars 16A to 16D and 17A to 17E, and therefore dies for forming such indent portions, as well as an indent portion-forming process, are unnecessary, and therefore the production cost is further reduced.

The bus bars 16A to 16D and the bus bars 17A to 17E have no indent portion, and have a simple straight configuration, and it is only necessary to arrange the bus bars 16A to 16D in neat order at the predetermined pitch P2 and also to arrange the bus bars 17A to 17E in neat order at the predetermined pitch P1, and therefore the general-purpose ability of the bus bars 16A to 16D and 17A to 17E are markedly enhanced, and the time and labor, required for the assembling operation, are reduced.

Figure 8A:
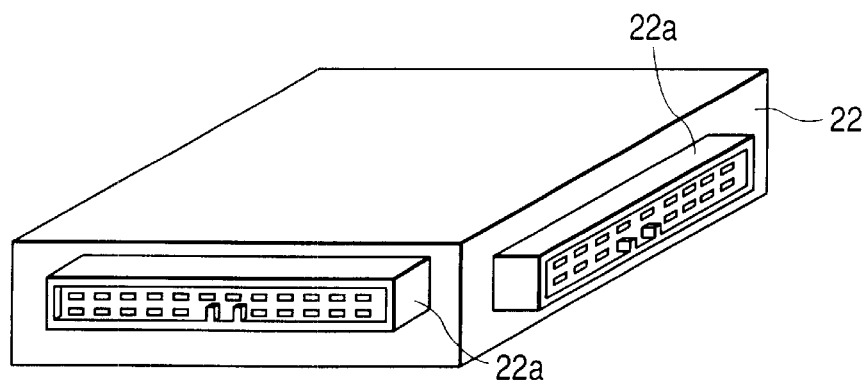
FIG. 8A is a perspective view of an electric connection box of the horizontally-projecting type.
Figure 8B:
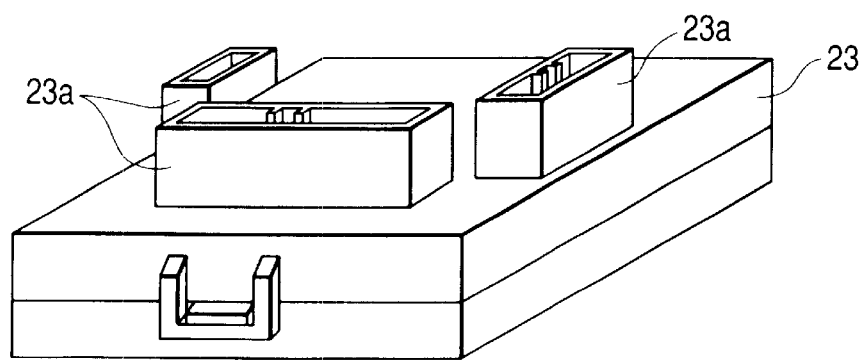
FIG. 8B is a perspective view of an electric connection box of the vertically-projecting type.

In the above embodiment, the connector tab terminals a to d and a' to d', disposed in a horizontal plane, are formed on the bus bars 16A to 16D while the connector tab terminals A to E and A' to E', disposed in a horizontal plane, are formed on the bus bars 17A to 17E. Therefore, this bus bar structure is used in an electric connection box 22 (see FIG. 8A) of the horizontally-projecting type in which the tab terminals a to d, a' to d', A to E and A' to E' project from housings 22a provided at side surfaces of the electric connection box 22. However, the bus bar structure can be used in an electric connection box 23 (see FIG. 8b) of the vertically-projecting type, in which case the connector tab terminals a to d and a' to d' are bent perpendicularly relative to the bus bars 16A to 16D, and similarly the connector tab terminals A to E and A' to E' are bent perpendicularly relative to the bus bars 17A to 17E, and the tab terminals a to d, a' to d', A to E and A' to E' project from connector housings 23a provided on an upper surface of the electric connection box 23. The connector housing or housings 22a of the horizontally-projecting type and the connector housing or housings 23a of the vertically-projecting type can be used in combination on the electric connection boxes 22 and 23.

Figure 2C:
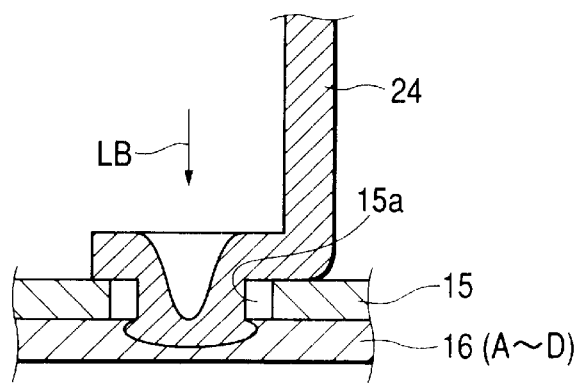
FIG. 2C is an enlarged cross-sectional view similar to FIG. 2A, but showing a modified form of the invention employing separate tab terminals.

FIG. 2C shows a modified form of the invention in which instead of the vertical bus bars 17A to 17E, separate tab terminals 24 are provided on the upper side of the insulating plate 15, and a laser beam LB is applied to each of these tab terminals 24, so that the laser beam-applied portion of each tab terminal 24 is fused or melted, and this fused portion flows through the through hole 15a, and is fused to the mating bus bar 16 (A to D) while melting part of this bus bar 16 (A to D), and as a result the tab terminals 24, disposed on the upper side of the insulating plate 15, are electrically connected to the bus bars 17A to 17E disposed on the lower side of the insulating plate 15.

With this construction, each of the bus bars 16A to 16d can have not only the tab terminals a to d and a' to d', formed respectively at the opposite ends thereof, but also the tab terminal or terminals 24 intermediate the opposite ends thereof.

As is clear from the foregoing description, in the bus bar-connecting structure of the invention, the vertical bus bars are arranged on one side of the insulating plate while the horizontal bus bars are arranged on the other side of the insulating plate, and a laser beam is applied to the bus bars, disposed on one of the opposite sides of the insulating plate, at selected ones of the intersection portions, so that each laser beam-applied portion of the bus bars is melted, and flows through the through hole, and is fused to the mating bus bar on the other side of the insulating plate, and the bus bars, disposed on the opposite sides of the insulating plate, are electrically connected together.

Therefore, the effects, similar to those of the conventional structure, are achieved, and besides it is not necessary to form any indent portion at the bus bars, and therefore the dies for forming such indent portions, as well as an indent portion-forming process, are not necessary, and therefore the production cost is lower.

The bus bars have no indent portion, and have a simple straight configuration, and it is only necessary to arrange each group of bus bars in neat order at the predetermined pitch, and therefore the general-purpose ability of the bus bars are markedly enhanced, and the time and labor, required for the assembling operation, are reduced.

Selected ones of the intersection portions of the bus bars are removed. With this construction, the bus bars, arranged in the same layer, are electrically disconnected from each other, thereby providing independent circuits, and therefore the number of the circuits can be increased.

What is claimed is:

1. A bus bar-connecting structure for being received in an electric connection box, comprising:

an insulating plate;

vertical bus bars arranged on one side of said insulating plate at a predetermined pitch and extending straight in a vertical direction;

horizontal bus bars arranged on the other side of said insulating plate at a predetermined pitch and extending straight in a horizontal direction;

through holes defined through portions of said insulating plate that are disposed at intersection portions of said vertical bus bars and said horizontal bus bars provided on the opposite sides of said insulating plate; and at least one of the intersection portions of the vertical and horizontal bus bars including a laser beam applied portion, the laser beam applied portion including a melt portion located on the one side or the other side of said insulating plate and flowable through at least one corresponding through hole upon application of a laser beam so as to fuse the melt portion to the bus bar on the other side of the insulating plate to the mating bus bar on the other side of said insulating plate, and said bus bars, disposed on the opposite sides of said insulating plate, being electrically connected together.

2. A bus bar-connecting structure according to claim 1, in which at least one of said intersection portions of said bus bars is removed.

3. The bus bar-connecting structure according to claim 1, the vertical and horizontal bus bars defining upper and lower planar surfaces free from indent portions.

* * * * *